United States Patent [19]
Zollo et al.

[11] Patent Number: 5,495,450
[45] Date of Patent: Feb. 27, 1996

[54] METHOD AND ASSEMBLY FOR MOUNTING AN ELECTRONIC DEVICE HAVING AN OPTICALLY ERASABLE SURFACE

[75] Inventors: James A. Zollo; Barbara R. Doutre, both of Plantation; Rudy Yorio, Boca Raton, all of Fla.

[73] Assignee: Motorola, Inc., Schaumburg, Ill.

[21] Appl. No.: 345,035

[22] Filed: Nov. 25, 1994

Related U.S. Application Data

[62] Division of Ser. No. 262,180, Jun. 20, 1994, Pat. No. 5,410,181.

[51] Int. Cl.$^6$ .............................. G11C 7/00; H01L 29/78
[52] U.S. Cl. ................................ 365/218; 257/681
[58] Field of Search ................ 365/218, 185.32; 257/680, 681, 323

[56] References Cited

U.S. PATENT DOCUMENTS

| | | | |
|---|---|---|---|
| 4,578,751 | 3/1986 | Erwin | 365/218 |
| 4,723,156 | 2/1988 | Okuaki | 257/681 |
| 5,300,808 | 4/1994 | Suppelsa | 257/680 |
| 5,311,059 | 5/1994 | Banerji et al. | 257/778 |

FOREIGN PATENT DOCUMENTS

| | | | |
|---|---|---|---|
| 5-189985 | 7/1993 | Japan | 365/218 |

*Primary Examiner*—Joseph A. Popek
*Attorney, Agent, or Firm*—Barbara R. Doutre

[57] ABSTRACT

An integrated circuit (106) having an optically erasable portion (114) is joined to a substrate (102) such that the optically erasable portion faces the substrate. The substrate (102) includes an aperture (104) that exposes the optically erasable portion (114) of the integrated circuit providing erasing capability to the integrated circuit (106). A plug (110) impermeable to light may be inserted into the aperture (104) to provide a sealed window to the optically erasable portion (114) of the integrated circuit (106).

7 Claims, 3 Drawing Sheets

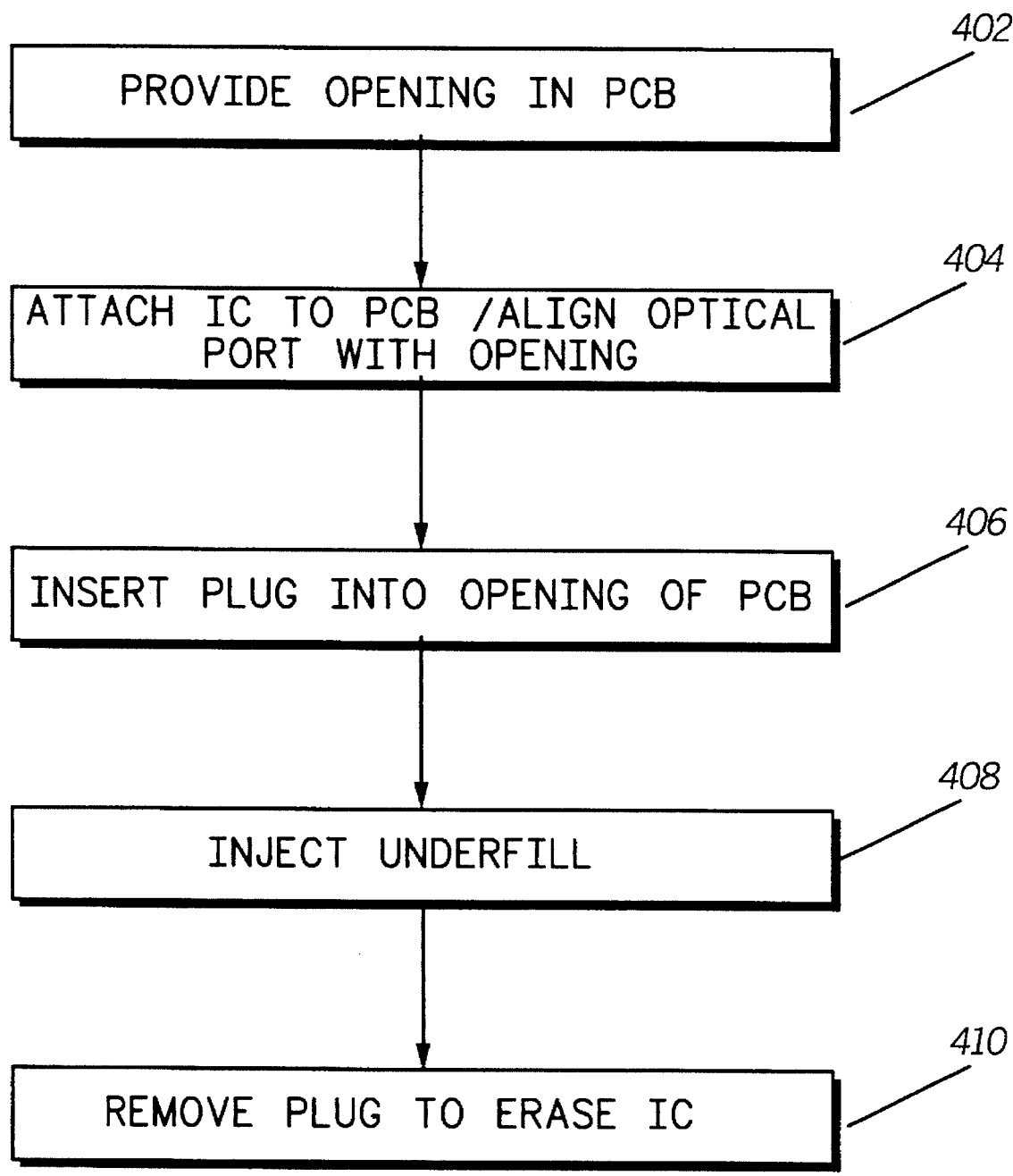

METHOD AND ASSEMBLY FOR MOUNTING AN ELECTRONIC DEVICE HAVING AN OPTICALLY ERASABLE SURFACE This is a divisional of pending patent application, Ser. No. 08/262,180 filed Jun. 20, 1994, now U.S. Pat. No. 5,410,181.

TECHNICAL FIELD

This invention relates generally to electronic devices and more specifically to optically erasable electronic devices.

BACKGROUND

Silicon integrated circuit chips (IC) are typically packaged in sealed enclosures, such as chip carriers or dual in-line packages (DIP), and interconnected with other components on printed circuit boards. The integrated circuit is typically connected to a carrier substrate with the active or upper surface of the integrated circuit facing away from the carrier substrate. Interconnection between the IC and the substrate is typically made by thin metal wires or wirebonds welded between the pads of the IC and the circuitry on the printed circuit board.

In an alternate packaging configuration known as flip-chip, the integrated circuit is bonded directly to the substrate by means of solder bumps or other metal interconnects and is mounted with the active surface facing the printed circuit board. This type of interconnection eliminates the expense, unreliability, and low productivity of manual or automated wirebonding. The, flip-chip or control-collapse-chip-connection (C4) utilizes solder bumps deposited on wettable metal terminals of the chip and a matching footprint of solder wettable terminals on the substrate. The flip-chip is aligned to the substrate, and all interconnections are made by reflowing the solder. This is opposite to the traditional method of bonding where the active side of the chip is facing up and is wirebonded to the substrate.

When a semiconductor device with an erasable programmable read only memory (EPROM) is mounted in the conventional manner, that is, wirebonded, its storage information can be erased by irradiating the EPROM with light of a certain wavelength. This erasure is performed by means of a window capable of transmitting ultraviolet light. Ceramic packages including this window are typically used for packaging such devices but present the disadvantage of having considerable bulk.

In products where down-sizing circuitry is key to maintaining a competitive edge, a device that would eliminate the cumbersome, costly and unreliable wirebonds and ceramic package would be advantageous. However, if a device such as an EPROM chip were flipped onto a printed circuit board, the ability to erase the EPROM would become impractical because the window would be facing the substrate. A packaged IC having an optically erasable surface facing the substrate would also present the same problem as the flip-chip device. Every time erasure would be desired the device would need to be removed from the printed circuit board. Hence, a technique and means of achieving erasing capability between a chip having an optically erasable surface facing towards the printed circuit board substrate is needed.

BRIEF DESCRIPTION OF THE DRAWINGS

FIG. 4 shows a flow chart in accordance with the present invention.

DETAILED DESCRIPTION OF THE PREFERRED EMBODIMENT

An associated C4 technology known in the art as Direct Chip Attach (DCA) allows for chips to be attached directly to a printed circuit board (pcb). In the preferred embodiment of the invention, a DCA process is used to mount an integrated circuit, such as an EPROM chip, to a pcb and to provide a means for programming and erasing the EPROM once it is attached to the board.

Figure 1:
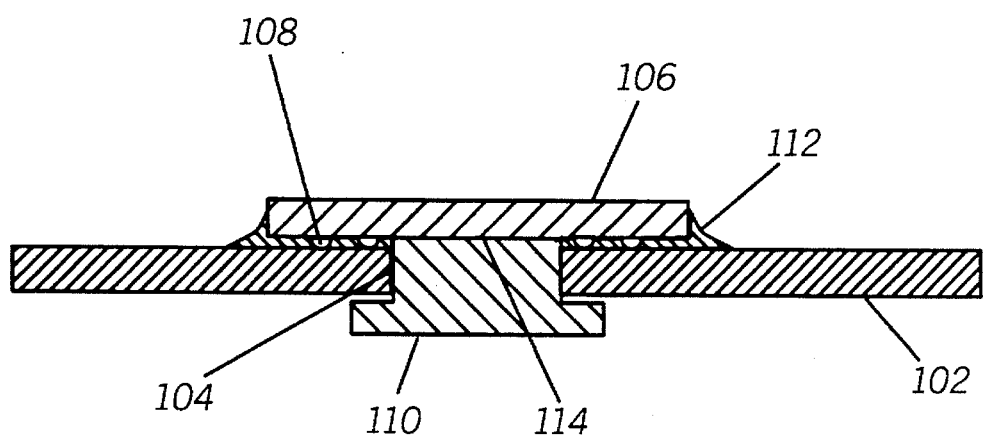
FIG. 1 shows a cross-sectional view illustrating an embodiment of an electronic assembly in accordance with the present invention.

Referring now to FIG. 1 of the accompanying drawings, there is shown an electronic assembly 100 in accordance with the present invention. A printed circuit board 102 is processed with an opening, or aperture, 104 of a predetermined size. A chip 106, such as an EPROM die, having an optically erasable portion 114 that is sensitive to light of a certain wavelength is mounted on to the pcb 102 preferably via the DCA process as known in the art. The EPROM 106 is preferably flipped onto the pcb 102 and aligned over the aperture 104 such that the opening 104 exposes the optically erasable portion 114 of the integrated circuit 106. The EPROM 106 includes an active surface having solder bumps 108 and the optically erasable portion 114. The active surface of the EPROM 106 now faces a metallization pattern of the pcb (to be shown later). Interconnection between the integrated circuit 106 and the pcb 102 is made by means of the solder bumps 108 which are aligned with the pads, or metallization pattern, of the pcb 102 and reflowed. The EPROM 106 is thus electrically attached to the metallization pattern of the pcb 102. Light of a certain wavelength, such as ultraviolet light, can now be applied to the EPROM 106 so that it may be erased and then be reprogrammed through the pcb.

Preferably, in order to protect the contents of the EPROM 106 from being accidentally erased or corrupted, a plug 110, impermeable to light of a certain wavelength, may be inserted through the opening 104 of the pcb 102 such that the plug seals the optically erasable portion 114 of the EPROM 106. The plug 110 is preferably manufactured with a light impermeable material such as TEXIN™ polyurethane manufactured by Miles Inc. but may also be manufactured of other light blocking materials as well. The plug 110 may be removed whenever the EPROM 106 needs to be erased. The printed circuit board 106 in the preferred embodiment is manufactured out of a fire-retarding epoxy resin/glass cloth laminate (FR-4), but other compounds such as bismaleimide/triazine (BT) or polyimide may also be used.

For improved reliability, chip underfill 112 may be injected between the joined chip 106 and pcb substrate 102. This underfill 112 is preferably impermeable to light, such as ultraviolet light, to provide increased protection to the optically erasable portion 114 of the integrated circuit 106. The light blocking underfill 112 substantially fills the space between the chip 106 and the pcb 102 and surrounds the area about the plug in such a manner so as to leave the seal area intact, thus providing mechanical support and protection to the rest of the die. Light blocking underfill such as FP4450 V12 manufactured by Dexter-Hysol Inc. is an example of a material that blocks ultraviolet rays while FP4501 V20 manufactured by Dexter-Hysol Inc. is an example of a non light blocking underfill. While not all portions of the active surface of the die 106 are necessarily volatile, the light blocking underfill material 112 will provide increased protection against any light affecting the erasable portion 114 of the die. The plug 110 may then be removed and ultraviolet light applied through the aperture 104 in order to erase the EPROM 106. The plug 110 may then be returned to the aperture 104 to keep the optically erasable portion of the die protected. The electronic assembly 100 also allows the EPROM 106 to be programmed directly at the pcb by accessing programming interconnects or ports on the pcb. The plug 110 is preferably left in the aperture 104 while programming the EPROM 106 in order to protect against corrupted data.

Figure 2:
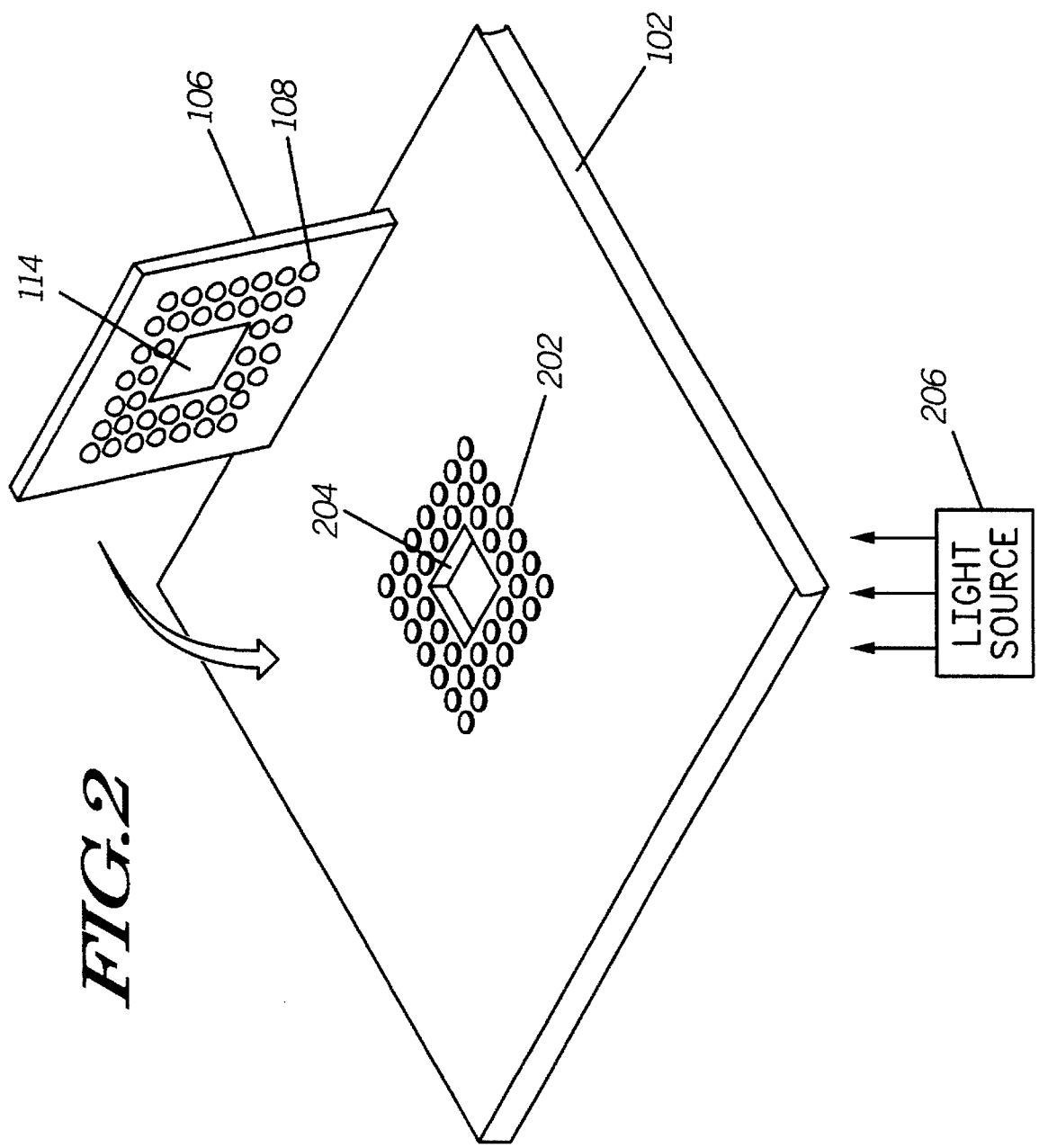
FIG. 2 shows a drawing of an exploded view of the electronic assembly of FIG. 1.

FIG. 2 illustrates an exploded view of the pcb 102 and integrated circuit 106 disassembled from each other. Flip-chip 106 has C4 bumps 108 preferably dispersed about its perimeter. Printed circuit board 206, preferably comprised of multiple surfaces, has corresponding substrate pads, also known as a metallization pattern, 202. The flip-chip 106 includes optically sensitive portion 114 used for erasing the chip. An aperture 204 is provided through the pcb surfaces and is surrounded by the metallization pattern 202 which provides the electrical interconnection to the rest of the pcb. The C4 process is self aligning and the chip's bump pattern 108 will align with the corresponding substrate pads 202. The aperture 204 is the same size or preferably slightly larger than the optically erasable area 114 of the EPROM 106 such that a plug, once inserted through the aperture, will provide a seal to the optically erasable portion 114 of the chip. Also, included in FIG. 2 is a light source 206 for providing erasure capability to the chip 106 once assembled to the pcb 102.

Figure 3:
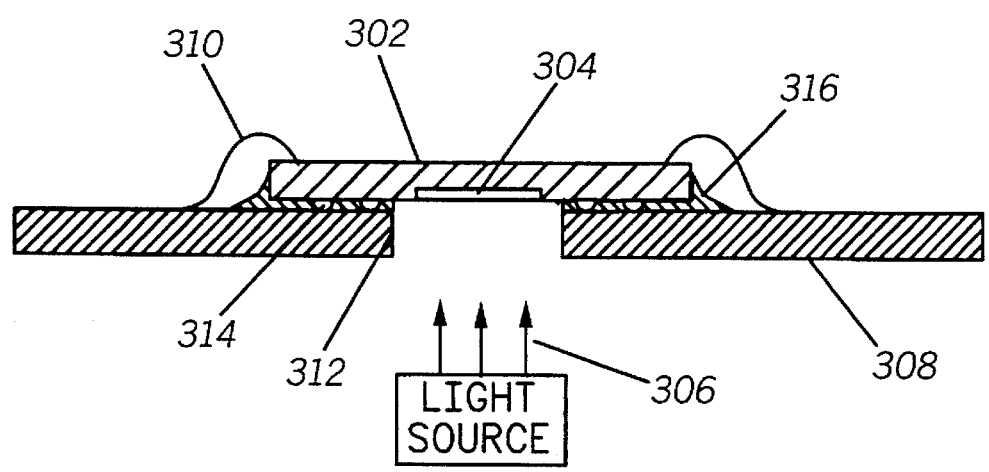
FIG. 3 shows a cross-sectional view of another embodiment of an electronic assembly in accordance with the present invention.

This invention also applies to a flip-chip on a chip carrier substrate where the carrier substrate (as the pcb) would have an opening formed so as to expose the optically erasable surface of the chip to allow for programming of the flip-chip once attached to the carrier. Any semiconductor device, including those that are wire bonded in the conventional manner, having an optical port facing downwards (i.e. towards the surface of the substrate to which it is attached) may use the process as described by the invention. FIG. 3 of the accompanying drawings shows an example of a semi-conductor device 302 having an optical port 304 for receiving light of a predetermined wavelength 306, such as ultraviolet light. The semiconductor 302 is shown wirebonded to a printed circuit board 308 using typical wirebond technology 310. Printed circuit board 308 includes an aperture 312 for allowing a light signal 306 to access the optical port 304. In addition to the wirebonding 310, the semiconductor device may also be attached to the printed circuit board with the DCA process using solder bumps 314. Underfill material 316 may then be added if desired.

FIG. 4 shows a flow chart 400 in accordance with the present invention. The flow chart 400 provides a method for attaching an integrated circuit (IC) having a light alterable surface, or optical port, to a printed circuit board having first and second surfaces. Flow chart 400 further shows the steps involved in erasing an integrated circuit, such as the EPROM 106, once it has been attached to the printed circuit board.

Initially, step 402 provides an opening through the first and second surfaces of the printed circuit board. This opening is selected based on the size of the optically erasable portion of the integrated circuit. Next, the integrated circuit is electrically attached, either through a flip-chip process or wirebond process, to the first surface of the printed circuit board in step 404, such that the optical port faces the first surface and aligns with the opening. This opening provides a window to the optically erasable portion of the integrated circuit. A removable plug is then inserted in step 406 into the opening, the plug provides a sealed window to the optical port of the integrated circuit. Underfill is then injected in step 408 about the plug and between the integrated circuit and the printed circuit board, but not blocking the area between the opening and the optical port. The plug may then be removed in step 410 in order erase the IC. The IC may be reprogrammed via programming ports of the pcb which interconnect with the metallization pattern of the pcb, preferably the plug is reinserted before reprogramming the IC.

Hence, the method as described by the invention provides a means for erasing an integrated circuit having an optical port facing a substrate. The substrate may be a printed circuit board, chip carrier, flex, or other similar mounting surface. By providing an aperture through the surfaces of the substrate, a window is provided to the optically erasable portion of the integrated circuit. The integrated circuit may be electrically attached to the pcb with wire bonds and/or a flip-chip process, but has the optical port facing the pcb. In a C4 or DCA process, metallization patterns on the pcb align with the bumps of the die such that the window allows exposure of the erasable portion of the die. Other flip-chip processes, such as gold bump and conductive epoxy bonding as known in the art, also apply to the assembly and method as described by the invention. The plug provides protection to the erasable portions of the die against light, such as ultraviolet rays, and furthermore acts as a dam to prevent any injected underfill from covering the optical erasable surface of the die. While the underfill does not necessarily have to be impermeable to ultraviolet light, it may be added to provide extra mechanical support to the die.

The method and assembly as described by the invention, allows integrated circuits, such as EPROMs and other semiconductor devices having programming capability, to be serviced directly on board and therefore relieves the need for large packaging requirements or any removal of the die from the printed circuit board.

What is claimed:

1. A method for erasing an integrated circuit having an optically erasable portion, the method comprising the steps of:

attaching the integrated circuit to a first surface of a printed circuit board having first and second surfaces, such that the optically erasable portion faces the first surface of the printed circuit board;

providing an opening through the first and second surfaces of the printed circuit board, the opening providing a window to the optically erasable portion of the integrated circuit;

applying light of a predetermined wavelength through the opening to erase the integrated circuit; and preventing further erasure by inserting a plug into said opening, said plug sealing the window to said optically erasable portion of the integrated circuit.

2. A method as described in claim 1, wherein the step of attaching includes the step using a flip-chip process to attach the integrated circuit to the first surface of the printed circuit board.

3. A method as described in claim 2, further including the step of wirebonding the integrated circuit to the first surface of the printed circuit board after the step of using the flip chip process.

4. A method as described in claim 1, further comprising the step of injecting underfill material about the plug between the integrated circuit and the printed circuit board without blocking the optically erasable portion of the integrated circuit.

5. A method as described in claim 4, wherein the underfill material is impermeable to light of a certain wavelength.

6. A method as described in claim 1, wherein the step of attaching includes the step of wirebonding the integrated circuit to the first surface of the printed circuit board.

7. A method as described in claim 1, wherein the integrated circuit is an electrically programmable erasable memory integrated circuit.

* * * * *